(12) United States Patent
Kumura et al.

(10) Patent No.: US 7,573,084 B2
(45) Date of Patent: Aug. 11, 2009

(54) NON-VOLATILE SEMICONDUCTOR MEMORY DEVICE AND METHOD FOR FABRICATING THE SAME

(75) Inventors: Yoshinori Kumura, Kanagawa-ken (JP); Tohru Ozaki, Tokyo (JP); Iwao Kunishima, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 11/898,949

(22) Filed: Sep. 18, 2007

(65) Prior Publication Data
US 2008/0073682 A1    Mar. 27, 2008

(30) Foreign Application Priority Data
Sep. 25, 2006   (JP)   ............................. 2006-259509

(51) Int. Cl.
*H01L 27/108* (2006.01)
(52) U.S. Cl. .................. 257/295; 257/297; 257/310
(58) Field of Classification Search .................. 257/295, 257/297, 310
See application file for complete search history.

(56) References Cited

FOREIGN PATENT DOCUMENTS

JP   2003-115545   4/2003

*Primary Examiner*—Douglas M Menz
(74) *Attorney, Agent, or Firm*—Finnegan, Henderson, Farabow, Garrett & Dunner, L.L.P.

(57) ABSTRACT

According to an aspect of the present invention, there is provided a non-volatile semiconductor memory device, including a ferroelectric capacitor being stacked a first electrode, a ferroelectric film and a second electrode in order, a first protective film with hydrogen barrier performance, the first protective film being formed under the first electrode and on a side-wall of the ferroelectric capacitor, the first protective film being widened from the second electrode towards the first electrode, a second protective film with hydrogen barrier performance, the second protective film being formed over the second electrode and on the first protective film formed on the side-wall of the ferroelectric capacitor, the second protective film being widened from the first electrode towards the second electrode, a cell transistor, a source of the cell transistor being connected to the first electrode, a drain of the cell transistor being connected to a bit line and a gate being connected to a word line.

20 Claims, 18 Drawing Sheets

NON-VOLATILE SEMICONDUCTOR MEMORY DEVICE AND METHOD FOR FABRICATING THE SAME

CROSS REFERENCE TO RELATED APPLICATION

This application is based upon and claims the benefit of priority from the prior Japanese Patent Application No. JP2006-259509, filed Sep. 25, 2006, the entire contents of which are incorporated herein by reference.

FIELD OF THE INVENTION

The present invention relates to a non-volatile semiconductor memory device and a method for fabricating the non-volatile semiconductor memory device.

DESCRIPTION OF THE BACKGROUND

Recently, non-volatile semiconductor memory device with a ferroelectric material represented by such as lead zirconium titanate (PZT:Pb(Zr,Ti)$O_3$), bismuth strontium tantalite (SBT:SrBi$_2$Ta$_2$O$_9$) or the like as a capacitance insulator has been especially noted regarding to high speed and low consumption power.

The ferroelectric materials are metal oxides, therefore, are easily reduced by a strong reductive gas such as hydrogen or the like. As a result, the electrical characteristics are deteriorated to lower reliability of the ferroelectric capacitor. To overcome the results mentioned above, the ferroelectric capacitor is covered with an insulative hydrogen barrier film, such as an aluminum-oxide film formed by sputtering, so that the hydrogen barrier performance is improved.

However, as miniaturization of the non-volatile semiconductor memory device has proceeded, an aspect ratio of the ferroelectric capacitor has been increased to lower step coverage of the hydrogen barrier film in sputtering technology. As a result, the thickness of the hydrogen barrier film formed on the side-wall of the ferroelectric capacitor is decreased to reduce the hydrogen barrier performance.

Consequently, improvement of the step coverage on the side-wall of the ferroelectric capacitor is disclosed, for example, in Japanese Patent Publication (Kokai) No. 2003-115545.

The ferroelectric capacitor disclosed in Japanese Patent Publication (Kokai) No. 2003-115545, is stacked a lower portion electrode, the ferroelectric film and an upper portion electrode on a silicon substrate in order. Further, a Ta$_2$O$_5$ film is formed on the side-wall of the ferroelectric capacitor, subsequently, an Al$_2$O$_3$ film is formed on the Ta$_2$O$_5$ film by MOCVD (Metal Organic Chemical Vapor Deposition). Adhesion between the side-wall of the ferroelectric capacitor and the Al$_2$O$_3$ film is improved by being sandwiched the insulator such as the Ta$_2$O$_5$ or the like between the side-wall of the ferroelectric capacitor and the Al$_2$O$_3$ film, so that the step coverage with an aspect ratio being 1-2 in the side-wall of the dielectric capacitor is also improved.

However, the ferroelectric capacitor disclosed in Japanese Patent Publication (Kokai) No. 2003-115545 may be damaged in the film growth in MOCVD. Because hydrogen as a carrier gas in MOCVD or a material gas with an organic metal material is included in the processing step. Therefore, the ferroelectric film is exposed against hydrogen, even if being temporarily.

SUMMARY OF THE INVENTION

According to an aspect of the present invention, there is provided a non-volatile semiconductor memory device, including a ferroelectric capacitor being stacked a first electrode, a ferroelectric film and a second electrode in order, a first protective film with hydrogen barrier performance, the first protective film being formed under the first electrode and on a side-wall of the ferroelectric capacitor, the first protective film being widened from the second electrode towards the first electrode, a second protective film with hydrogen barrier performance, the second protective film being formed over the second electrode and on the first protective film formed on the side-wall of the ferroelectric capacitor, the second protective film being widened from the first electrode towards the second electrode, a cell transistor, a source of the cell transistor being connected to the first electrode, a drain of the cell transistor being connected to a bit line and a gate being connected to a word line.

Further, another aspect of the invention, there is provided, a method for fabricating a non-volatile semiconductor memory device including, forming a first protective film with hydrogen barrier performance over a substrate having a cell transistor thereon via an interlayer dielectric film, stacking a first electrode, a ferroelectric film and a second electrode in order so as to form a ferroelectric capacitor over the first protective film, etching the first protective film by sputtering etching so as to deposit the first protective film scattered by the etching on the side-wall of the ferroelectric capacitor, forming a second protective film with hydrogen barrier performance on the first protective film formed on the second electrode and the side-wall of the ferroelectric material by sputtering, and connecting a source of the cell transistor to the first electrode, a drain of the cell transistor to bit line, a gate of the cell transistor to a word line and the second electrode to a first potential line.

DETAILED DESCRIPTION OF THE INVENTION

Figure 1:
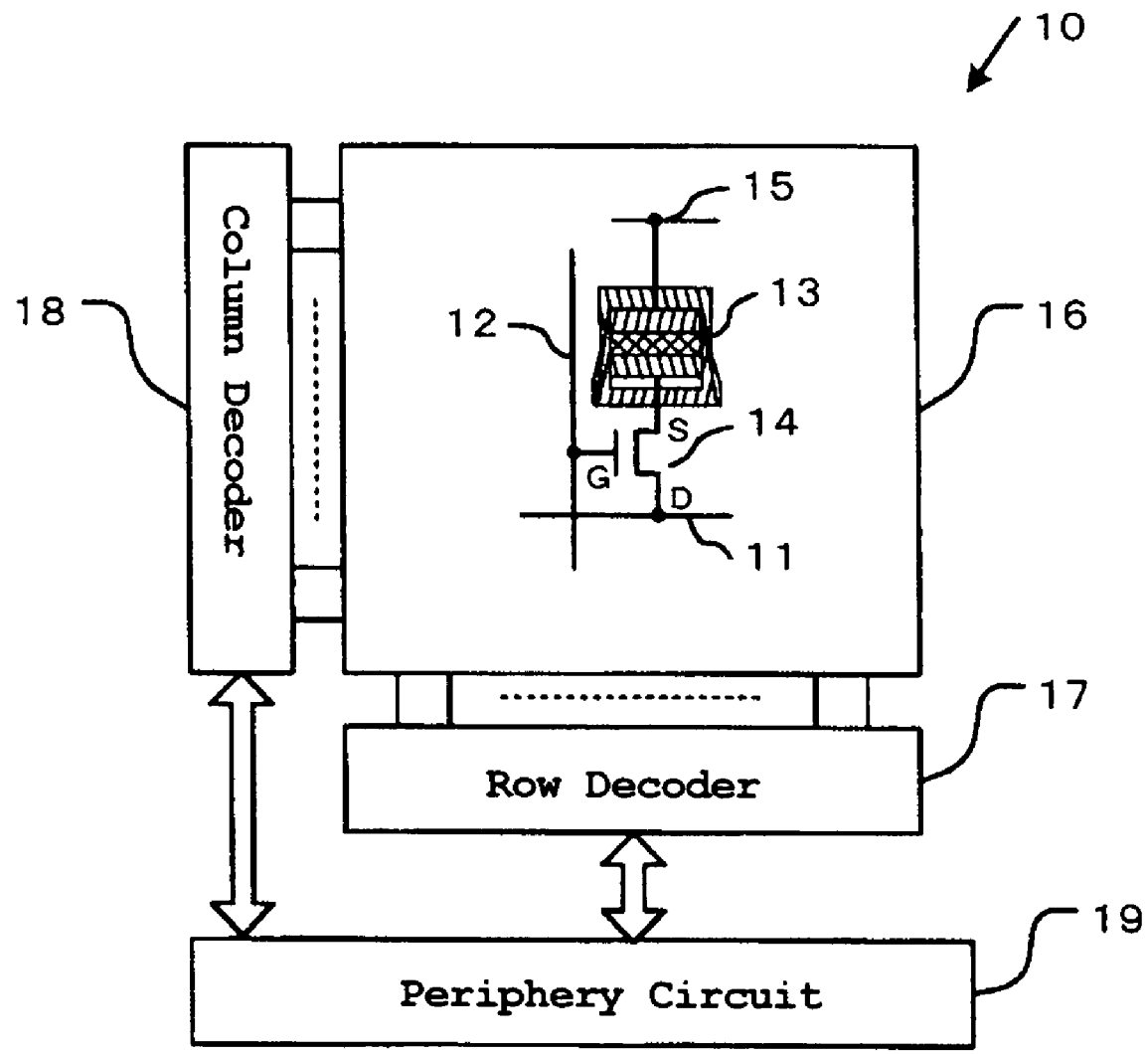
FIG. 1 is a block diagram showing a non-volatile semiconductor memory device according to a first embodiment of the present invention.

Embodiments of the present invention will be described below in detail with reference to the attached drawings. It should be noted that the present invention is not restricted to the embodiments but covers their equivalents. Throughout the attached drawings, similar or same reference numerals show similar, equivalent or same components.

First Embodiment

Figure 2:
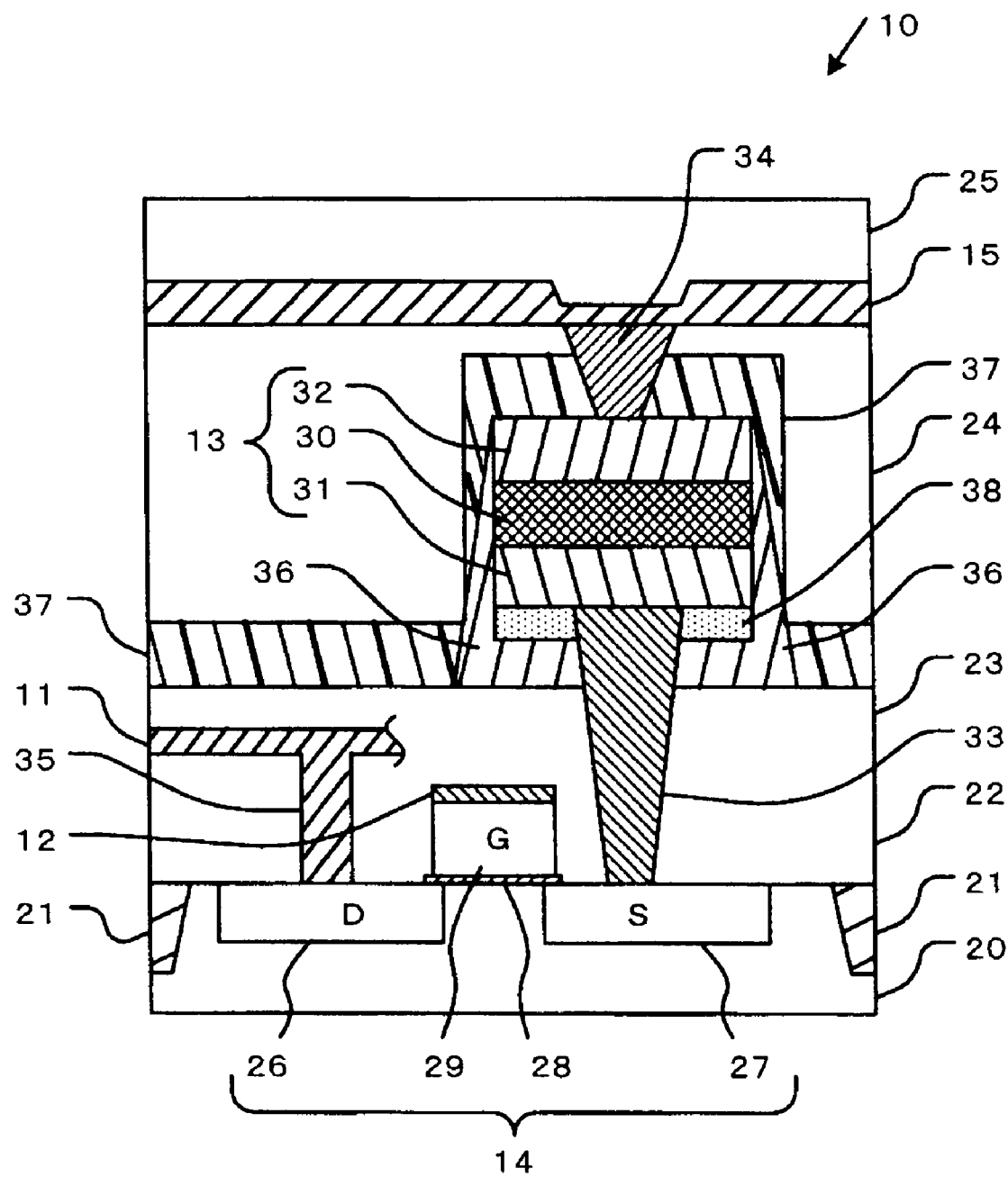
FIG. 2 is a cross-sectional view showing a structure of the non-volatile semiconductor memory device according to the first embodiment of the present invention.

First, a non-volatile semiconductor memory device according to a first embodiment of the present invention will be described below in detail with reference to FIG. 1 and FIG. 2. FIG. 1 is a block diagram showing the non-volatile semiconductor memory device. FIG. 2 is a cross-sectional view showing a structure of the non-volatile semiconductor memory device.

As shown in FIG. 1, a non-volatile memory device 10 in this embodiment includes a bit line 11 and a word line 12 configured as a matrix, and a memory cell array 16. The memory cell array 16 includes a ferroelectric capacitor 13 having a ferroelectric film being sandwiched between a first electrode and a second electrode, a switching cell transistor 14 and a common interconnection 15 (first potential line). The ferroelectric capacitor 13 configured at an orthogonal portion being crossed by the bit line 11 and the word line 12. The cell transistor 14 for switching includes a drain D being connected to the bit line 11, a source S being connected to the first electrode of the ferroelectric capacitor 13 and a gate G being connected to the word line 12.

Further, the non-volatile memory device 10 in this embodiment includes a low decoder 17, a column decoder 18 and a periphery circuit 19. The low decoder 17 and the decoder column 18 select the ferroelectric capacitor 13 in the memory cell array 16. The periphery circuit 19 drives the low decoder 17 and the column decoder 18 and reads data from the selected ferroelectric capacitor 13. The periphery circuit 19 also sends out data and writes data obtained from an outer region into the selected ferroelectric capacitor 13.

As shown in FIG. 2, the non-volatile memory device 10 is formed over a semiconductor substrate 20, for example, a silicon substrate. The cell transistor 14 is formed in a region being surrounded by an element isolation layer 21 configured in the semiconductor substrate 20. The ferroelectric capacitor 13 is formed via an interlayer dielectric film 22, for example a TEOS (Tetra Ethyl Ortho Silicate) film over the bit line 11. The common interconnection 15 is formed over an interlayer dielectric film 24 for example a TEOS film and is covered with an insulator 25.

The cell transistor 14 includes a drain diffusion layer 26, a source diffusion layer 27, a gate insulator 28 and a gate electrode 29. The drain diffusion layer 26 and the source diffusion layer 27 are separately formed in the region being surrounded by the element isolation layer 21 formed in the semiconductor substrate 20. The gate insulator 28 is formed between the drain diffusion layer 26 and the source diffusion layer 27, and the gate electrode 29 is formed on the gate insulator 28.

The ferroelectric capacitor 13 includes a ferroelectric film 30, for example lead zirconium titanate (PZT), a first electrode 31 formed on the lower surface of the ferroelectric film 30, for example iridium (Ir) and a second electrode 32 formed on the upper surface of the ferroelectric film 30, for example platinum (Pt).

The first electrode 31 of the ferroelectric capacitor 13 is connected to the source diffusion layer 27 of the cell transistor 14 via a first contact plug 33, for example, tungsten (W). The second electrode 32 of the ferroelectric capacitor 13 is connected to the common interconnection 15 via a second contact plug 34, for example aluminum (Al).

The drain diffusion layer 26 of the cell transistor 14 is connected to the bit line 11 through a via 35. The word line 12 is formed over the gate electrode 29 of the cell transistor 14 and side surfaces of the word line 12 and the gate electrode 29 are covered with side-wall film (not shown).

A first protective film 36 having hydrogen barrier performance, for example an aluminum-oxide film (hereafter, describe as $Al_2O_3$), is formed under the first electrode 31 of the ferroelectric capacitor 13 and the side-wall of the ferroelectric capacitor 13. The first protective film 36 widens from the second electrode 32 towards to the first electrode 31. A second protective film 37 having hydrogen barrier performance, for example an aluminum-oxide film (hereafter, describe as $Al_2O_3$), is formed over the first electrode 31 of the ferroelectric capacitor 13 and the side-wall of the ferroelectric capacitor 13. The second protective film 37 widens from the first electrode 31 towards to the second electrode 32.

An insulator 38 is formed between the first electrode 31 of the ferroelectric capacitor 13 and the first protective film 36. $Al_2O_3$ of the first protective film 36 is a poly-crystalline film with a texture structure. Therefore, it is prevented the texture structure of the first protective film 36 from transferring into the first electrode film 31 and the ferroelectric film 30 to influence of the texture structure on properties of the first electrode film 31 and the ferroelectric film 30.

The first protective film 36 is formed on the side-wall of the ferroelectric capacitor 13 being thicker at the lower side and thinner at the upper side. The second protective film 37 is formed on the side-wall of the ferroelectric capacitor 13 being thinner at the lower side and thicker at the upper side.

As a result, sum of thicknesses of the first protective film 36 and the second protective film 37 can be equalized between the upper side and the lower side of the side-wall of the ferroelectric capacitor 13 by means of adjusting the film thicknesses of the first protective film 36 and the second protective film 37. Accordingly, step-coverage at the side-wall of the ferroelectric capacitor 13 with large aspect ratio is improved, so that hydrogen barrier characteristics of the side-wall can be advanced.

Next, a method for fabricating the non-volatile semiconductor device 10 according to the first embodiment of the present invention will be described below in detail with reference to FIG. 3 to FIG. 9. FIGS. 3-9 are cross-sectional diagrams of the non-volatile semiconductor device 10 showing processing steps on the non-volatile semiconductor device 10.

Figure 3:
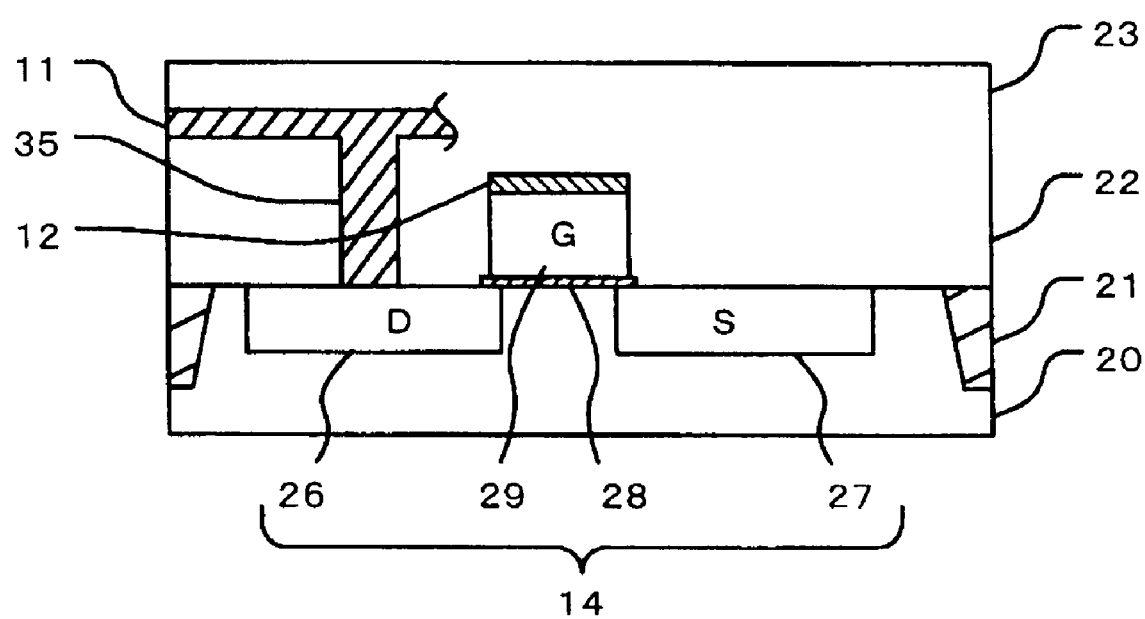
FIG. 3 is a cross-sectional view showing a fabricating process of the non-volatile semiconductor memory device in the first embodiment of the present invention.

Firstly, as shown in FIG. 3, a trench is formed in the semiconductor substrate 20, for example p-type silicon substrate, by RIE (Reactive Ion Etching). The element isolation layer 21 (STI: Shallow Trench Isolation) is formed in the inner region of the trench by embedding with an insulator, for example a silicon oxide film.

Next, a silicon oxide film is formed on the semiconductor substrate 20 by thermal oxidation. A poly-crystalline silicon film doped with an impurity is formed by CVD (Chemical Vapor Deposition). The gate insulator 28 and the gate electrode 29 are formed by using patterning technique with photo-lithography.

Next, a conductive impurity being different from the conductive-type in the semiconductor substrate 20, for example arsenic (As) is implanted into the semiconductor substrate 20 by using ion implantation so as to form the drain diffusion layer 26 and the source diffusion layer 27. As a result, the cell transistor 14 is completed.

Next, the word line 12 is formed on the gate electrode 29 and an interlayer dielectric film 22 is formed over the semiconductor substrate 20 with the cell transistor 14 by using CVD. The drain region 26 connects with the bit line 11 through the via 35, subsequently, an interlayer dielectric film 23 is formed.

Figure 4:
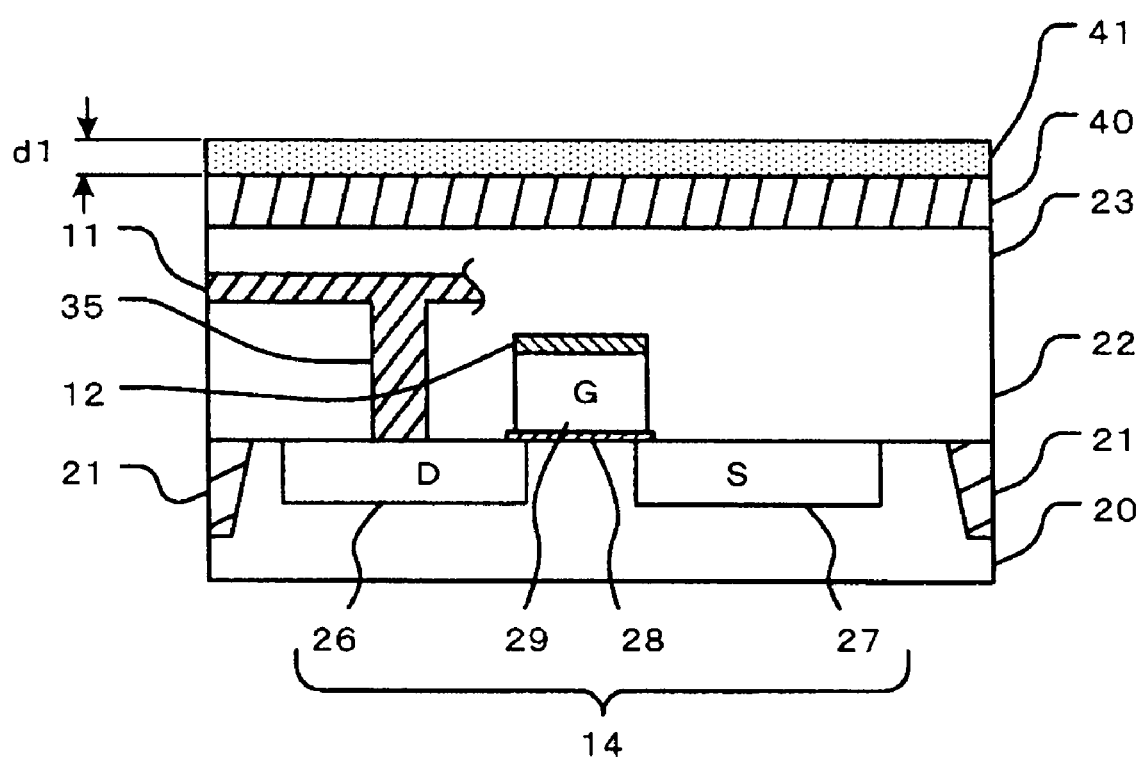
FIG. 4 is a cross-sectional view showing the fabricating process of the non-volatile semiconductor memory device in the first embodiment of the present invention.

Next, as shown in FIG. 4, an aluminum-oxide film 40 having a thickness of 50-100 nm, for example, is formed on the interlayer dielectric film 23 by sputtering in a mixed gas with argon (Ar) and oxygen ($O_2$), and a TEOS film 41 having a thickness of 50 nm, for example, is formed on the aluminum-oxide film 40 by CVD. The aluminum-oxide film 40 is the first protective film 36 and the TEOS film 41 is the insulator 38.

Here, oxygen is supplied from the first protective film 36 into the ferroelectric film 30 so as to be prevented desorption of oxygen from the ferroelectric film 30. Therefore, a component of the aluminum-oxide film 40 may be oxygen-rich comparing with a component of the aluminum-oxide film 40 mentioned after by adjusting a ratio between Ar and $O_2$ in the sputtering process.

Figure 5:
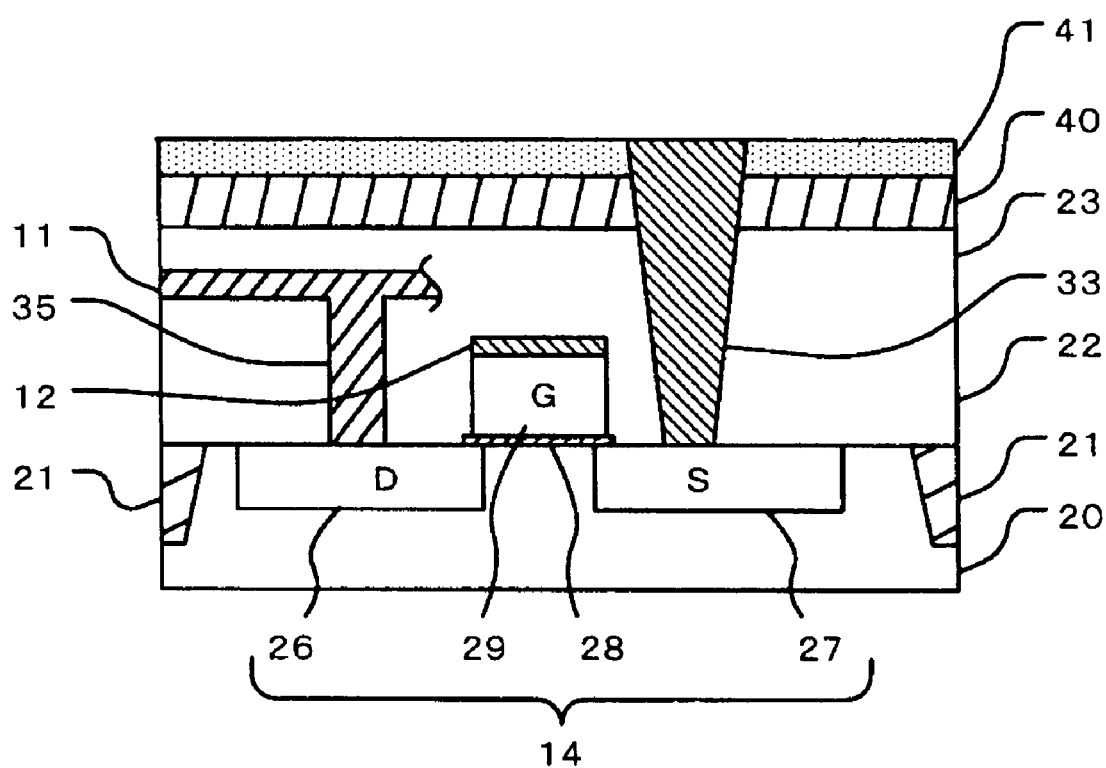
FIG. 5 is a cross-sectional view showing the fabricating process of the non-volatile semiconductor memory device in the first embodiment of the present invention.

Next, as shown in FIG. 5, a contact hole (not shown) is formed to the source diffusion layer 27 by drilling the TEOS film 41, the aluminum-oxide film 40 and the interlayer dielectric films 22, 23 using RIE, for example. The first contact plug 33 is formed by embedding tungsten (W) into the contact hole using CVD and CMP.

Figure 6:
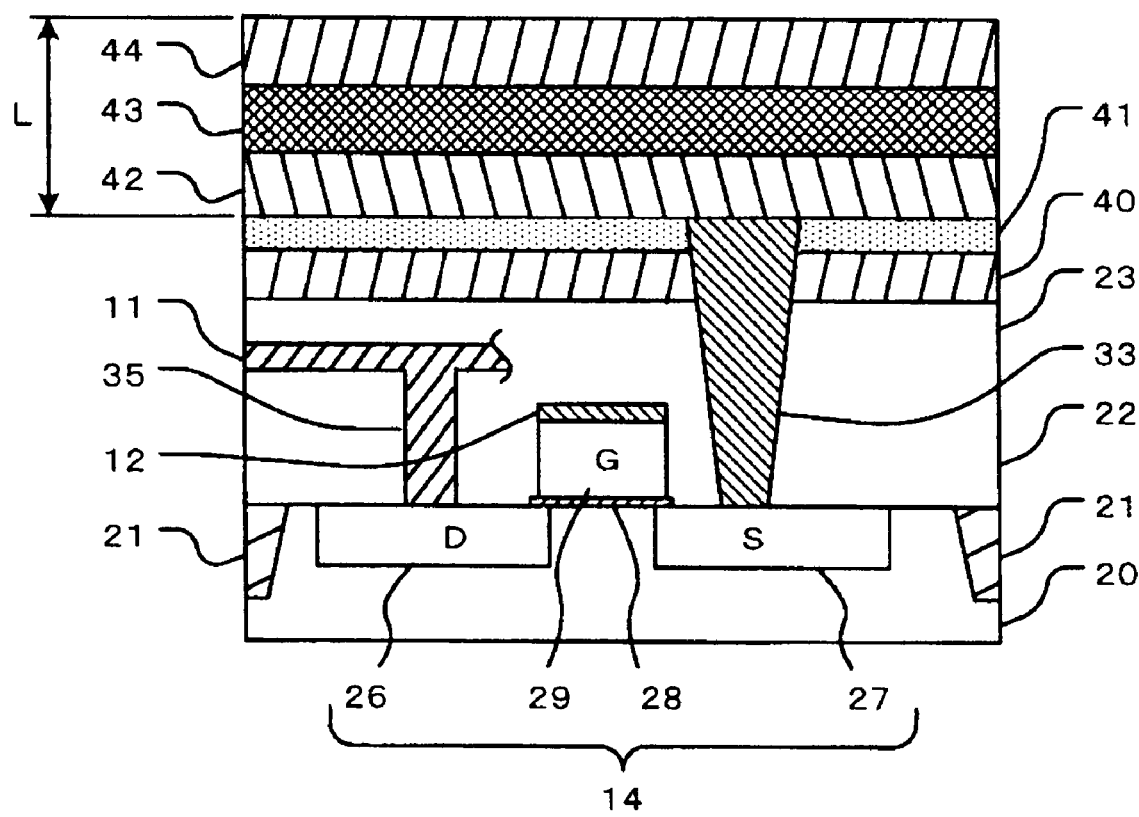
FIG. 6 is a cross-sectional view showing the fabricating process of the non-volatile semiconductor memory device in the first embodiment of the present invention.

Next, as shown in FIG. 6, an iridium film 42 with a film thickness of 200 nm, a lead zirconium titanate film 43 with a film thickness of 100 nm and a platinum film 44 with a film thickness of 100 nm are formed on the TEOS film 41 in order by sputtering, for example.

Here, as the iridium film 42 is the first electrode 31, the lead zirconium titanate film 43 is the ferroelectric film 30 and the platinum film 44 is the second electrode 32, the height L of the ferroelectric capacitor 13 reaches to 400 nm or so.

Figure 7:
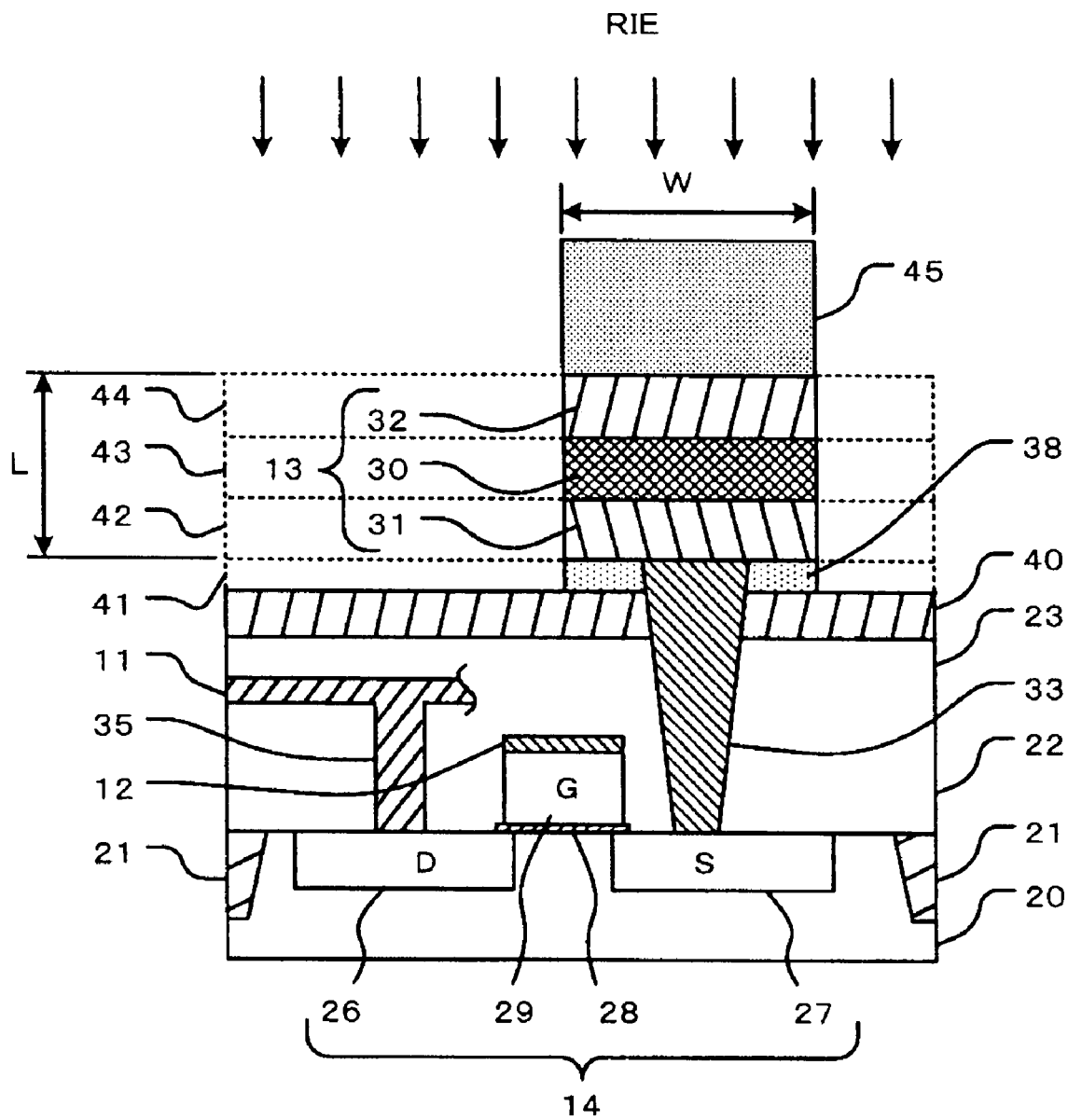
FIG. 7 is a cross-sectional view showing the fabricating process of the non-volatile semiconductor memory device in the first embodiment of the present invention.

Next, as shown in FIG. 7, a resist with a width W of 440 nm, for example, as a mask 45 is formed at a position corresponding to the first contact plug 33, for example. The platinum film 44, the lead zirconium titanate film 43, the iridium film 42 and the TEOS film 41 are successively etched by RIE using the mask 45.

In those processing steps mentioned above, the ferroelectric capacitor 13 with an aspect ratio (L/W) being approximately 1 is formed. The ferroelectric capacitor 13 is composed of the ferroelectric film 30 sandwiched between the first electrode 31 and second electrode 32. Further, the TEOS film 41 under the first electrode 31 is remained as the insulator 38. In experiments using sputtering, the step coverage of the ferroelectric capacitor 13 is lowered in the case of the ferroelectric capacitor 13 with a width W of 440 nm, even if the aspect ratio is 1 or so.

Figure 8:
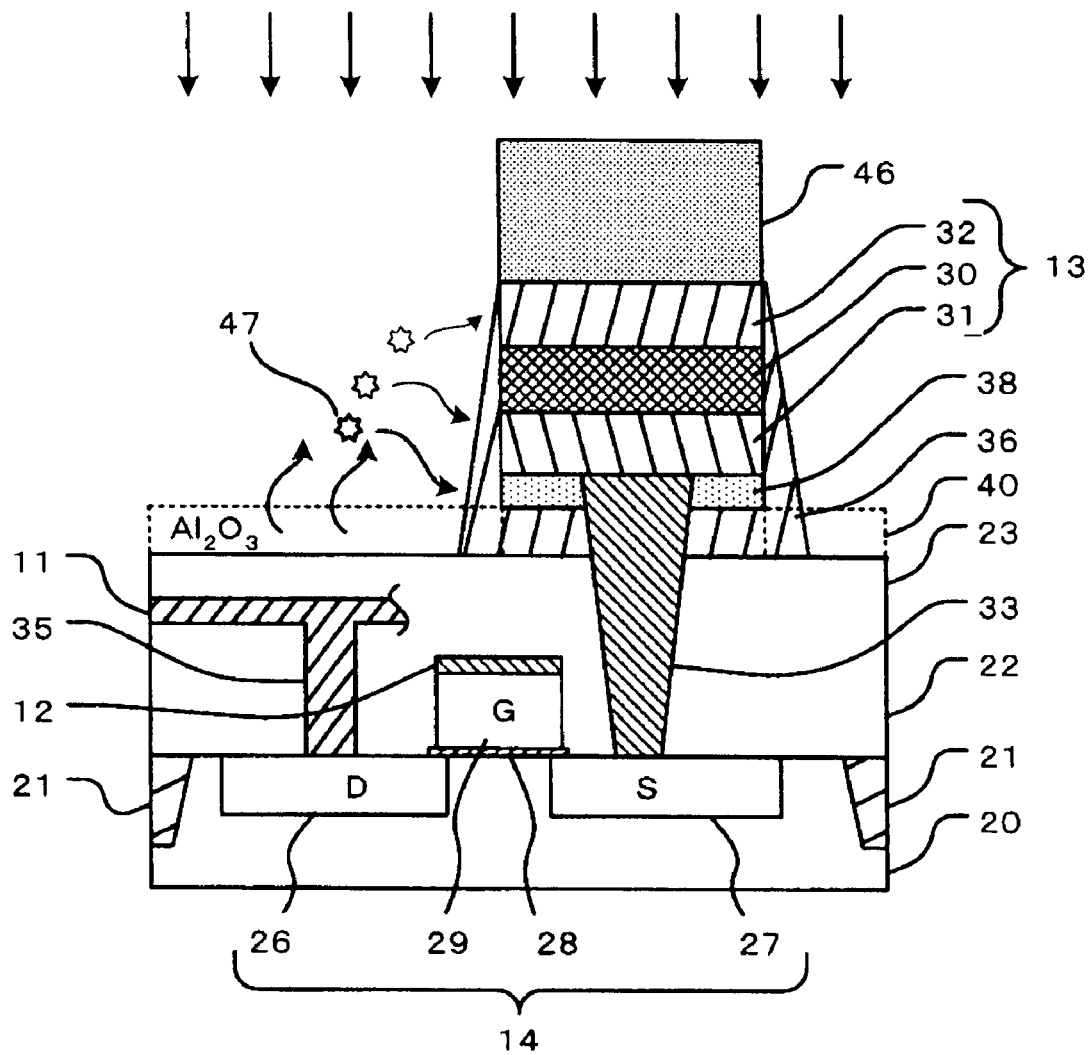
FIG. 8 is a cross-sectional view showing the fabricating process of the non-volatile semiconductor memory device in the first embodiment of the present invention.

Next, as shown in FIG. 8, the aluminum-oxide film 40 is etched by sputtering in a mixed gas with Ar and $O_2$ using a mask 46. An aluminum-oxide particle 47 scattered by etching is deposited on the side-wall of the ferroelectric capacitor 13. The deposited aluminum-oxide film 40 is thicker at the lower side and thinner at the upper side. Further, the aluminum-oxide film 40 under the first electrode 31 is remained without etching by sputtering.

Accordingly, protective film 36 is formed to be widened from the second electrode 32 to the first electrode 31 on the side-wall of the ferroelectric capacitor 13 as well as on the protective film 36 being formed under the first electrode 31 via the insulator 38.

Here, a component of the first protective film 36 may be oxygen-rich comparing with a component of the aluminum-oxide film 48 (second protective film 37) as mentioned below by adjusting a ratio between Ar and $O_2$.

Figure 9:
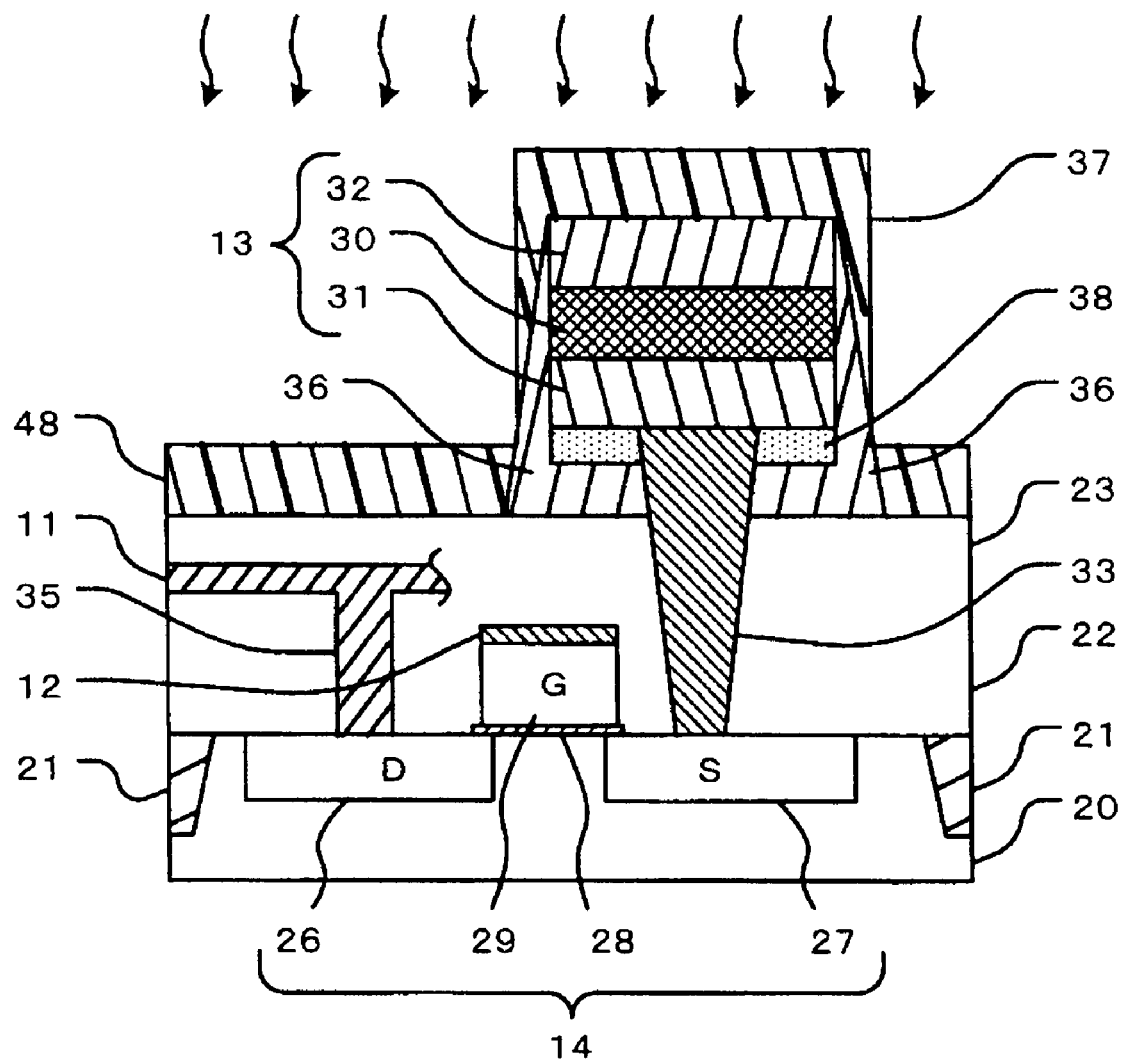
FIG. 9 is a cross-sectional view showing the fabricating process of the non-volatile semiconductor memory device in the first embodiment of the present invention.

Next, as shown in FIG. 9, after removing the mask 46, by sputtering in a mixed gas with Ar and $O_2$, the aluminum-oxide film 48 with a film thickness of 50-100 nm, for example, is formed on the interlayer dielectric film 23 including the ferroelectric capacitor 13 and the aluminum-oxide film 47 so as to act as the second protective film 37.

As the step coverage is lowered as increasing with the aspect ratio in sputtering, the aluminum-oxide film 48 formed on the side-wall of the ferroelectric capacitor 13 is thicker at the upper side and thinner at the lower side. Accordingly, the second protective film 37 is formed to be widened from the first electrode 31 to the second electrode 32 on the side-wall of the ferroelectric capacitor 13 as well as on the protective film 37 being formed on the second electrode 32.

Here, for improvement of hydrogen barrier characteristics of the second protective film 37, a component of the aluminum-oxide film 48 may be oxygen-rich comparing with a component of the aluminum-oxide film 40 as mentioned below by adjusting a ratio between Ar and $O_2$.

Next, the interlayer dielectric film 24 is formed on the second protective film 37 by CVD. A contact hole (not shown) is formed to the second electrode 32 by drilling the interlayer dielectric film 24 (not shown) and the second protective film 37 using RIE, for example. The first contact plug 34 (not shown) is formed by embedding Al into the contact hole using sputtering-reflow and CMP. Next, the common interconnection 15 (not shown) is formed on the interlayer dielectric film 24. The common interconnection 15 connect with the electrode 32 via the second contact plug 34. Finally, the insulator 25 is formed to complete the non-volatile memory device 10 including the ferroelectric capacitor 13. The ferroelectric capacitor 13 has fully hydrogen barrier performance as shown in FIG. 2.

As mentioned above, in this embodiment, the first protective film 36 is formed to be widened from the second electrode 32 to the first electrode 31 on the side-wall of the ferroelectric capacitor 13, reversely, the first protective film 37 is formed to be widened from the first electrode 31 to the second electrode 32.

Consequently, the step coverage of the sidewall of the ferroelectric capacitor 13 is improved by summing up the film thicknesses of the first protective film 36 and the second protective film 37. A protective film having a proper film thickness is obtained on the side-wall of the ferroelectric capacitor 13. Accordingly, the non-volatile memory device 10 fully including the dielectric capacitor 13 with hydrogen barrier characteristics and the method for fabricating the non-volatile memory device 10 are attained by optimizing the film thickness of the protective film.

Here, it is explained a case that the ferroelectric film 30 is lead zirconium titanate (PZT), however, bismuth strontium tantalite (SBT) or another ferroelectric film or the like may also be available.

Here, it is explained a case that the first protective film 31 and the second protective film 32 is the aluminum-oxide film, however, titanium-oxide may also be available. Further, aluminum-nitride, titanium-nitride or silicon-nitride may be also available. In the case that the first protective film 31 and the second protective film 32 are aluminum-nitride, a component of the first protective film 31 as same as the component of aluminum-oxide may be oxygen-rich as comparing with a component of the second protective film 32 and a component of the second protective film may be titanium-rich as comparing with a component of the first protective film.

Here, it is explained a case that the insulator 38 is sandwiched between the first electrode 31 and the first protective film 36, however, none of the insulator 38 may be also available.

Here, it is explained a case that the second protective film 37 is formed over the ferroelectric capacitor 13, however, removing the second protective film 37 around the ferroelectric capacitor 13 may be also available. According to the structure mentioned above, there is an advantage that a contact is easily formed on the cell transistor 14 or the like.

An aluminum-oxide film may be formed on the second protective film 37 by ALD (Atomic Layer Deposition). As ALD has better step coverage than sputter has, hydrogen barrier characteristics can be further improved. As Tri Methyl Aluminum (TMA) is used as a row material of aluminum in ALD, hydrogen is generated in the film process. However, the ferroelectric capacitor 13 is already covered with the first protective film 36 and the second protective film 37, as a result, damage cannot be generated in the hydrogen ambient.

Second Embodiment

Figure 10:
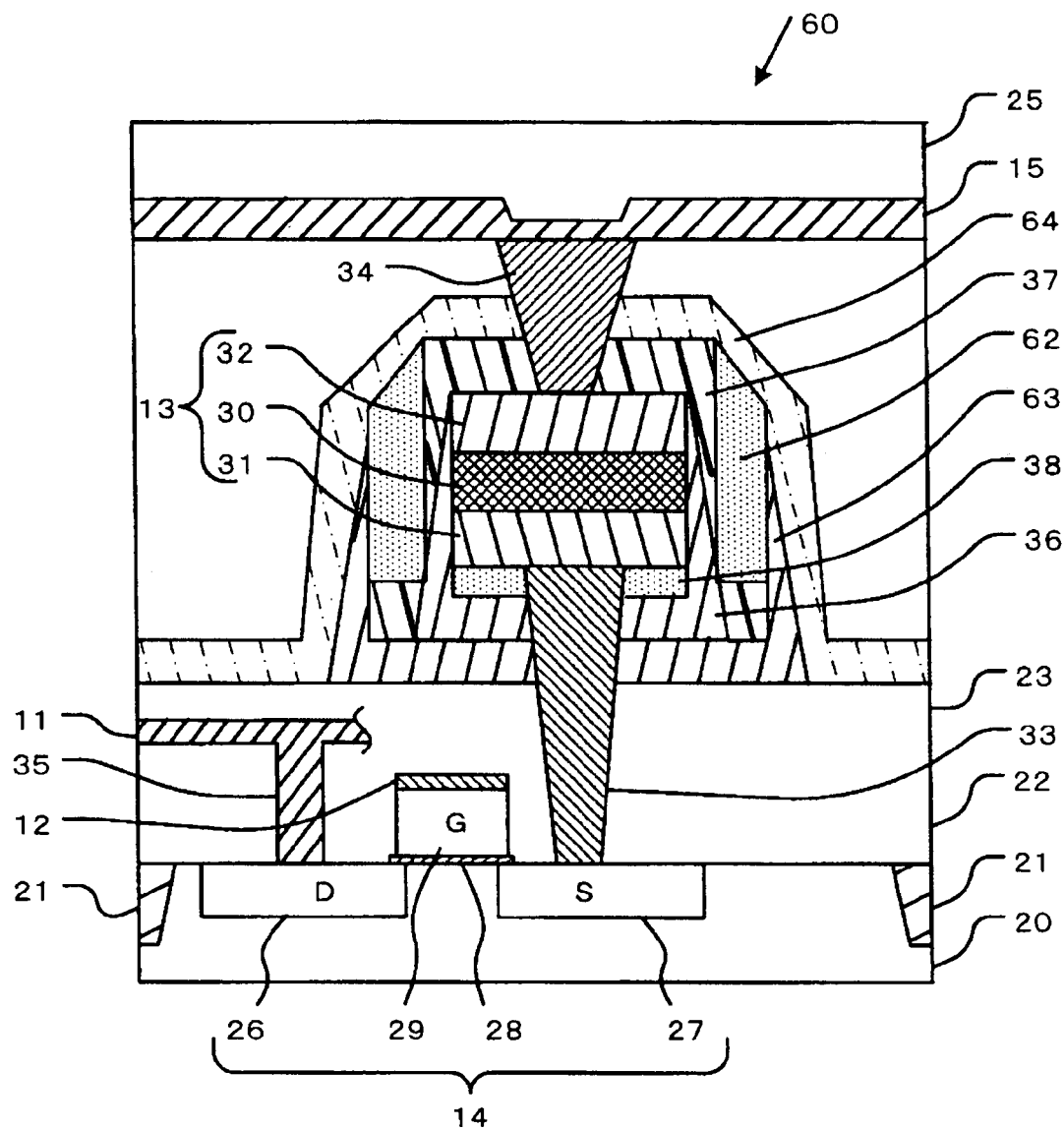
FIG. 10 is a cross-sectional view showing a structure of a non-volatile semiconductor memory device according to a second embodiment of the present invention.

FIG. 10 is a cross-sectional view showing a structure of a nonvolatile memory semiconductor device according to a second embodiment of the present invention. It is be noted that the same or similar reference numerals are applied to the same or similar parts and elements throughout the drawings, and the description of the same or similar parts and elements will be omitted or simplified.

The second embodiment is different from the first embodiment at a point, for example, that a third protective film and a fourth protective film are formed on the side-wall of the ferroelectric capacitor.

As shown in FIG. 10, a non-volatile memory device 60 in this embodiment includes the ferroelectric capacitor 13, the cell transistor 14, an insulator 62 and a third protective film 63. The insulator 62 is formed under the first protective film 36 which is located under the first electrode 31 formed at the lower side of the ferroelectric capacitor 13 and is formed on the second protective film 37 on the side-walls of the ferroelectric capacitor 13. For example, the third protective film 63 with hydrogen barrier performance is widened from the second electrode 32 to the first electrode 31 through the TEOS film.

Further, the non-volatile memory device 60 in this embodiment includes a fourth protective film 64 with hydrogen barrier performance. The fourth protective film 64 is formed over the second electrode 32 on the second protective film 37 and is widened on the side-wall of the third protective film 63 from the first electrode 31 to the second electrode 32 of the ferroelectric capacitor 13.

The third protective film 63 and the fourth protective film 64 may be composed of aluminum-oxide as same as the second protective film 37. A component of the aluminum-oxide may be aluminum-rich comparing with a component of the first protective film 36 as same as the second protective film 37.

The insulator 62 is formed between the second protective film 37 and the third protective film 63. This is because the insulator 62 relieves a surface roughness of the aluminum-oxide so as to further improve coverage of the protective film.

Here, the aluminum-oxide films are directly stacked up to two layers; as a result, the third layer of the aluminum-oxide film is layered via an insulator.

As mentioned above, the step coverage on the side-wall of the ferroelectric capacitor 13 is retained. Furthermore, the protective film with hydrogen barrier performance has a structure with four layers from the first protective film to the fourth protective film, so that hydrogen barrier characteristics on the sidewall of the ferroelectric capacitor 13 can be advanced.

Figure 11:
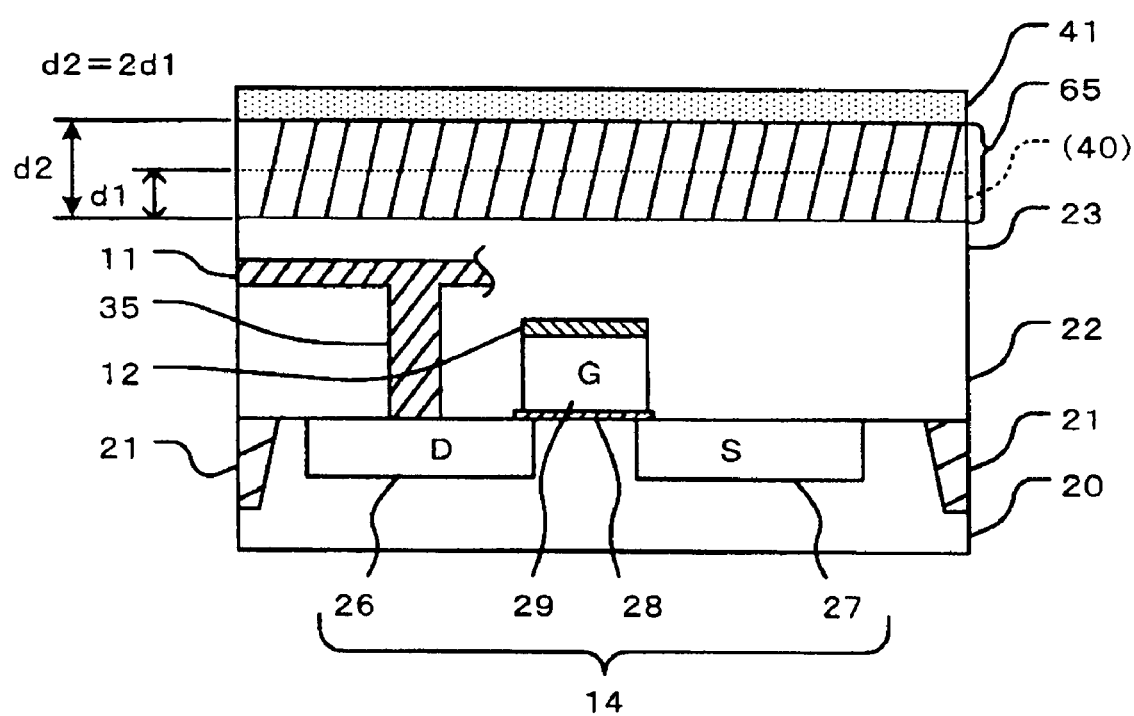
FIG. 11 is a cross-sectional view showing a fabricating process of the non-volatile semiconductor memory device in the second embodiment of the present invention.
Figure 12:
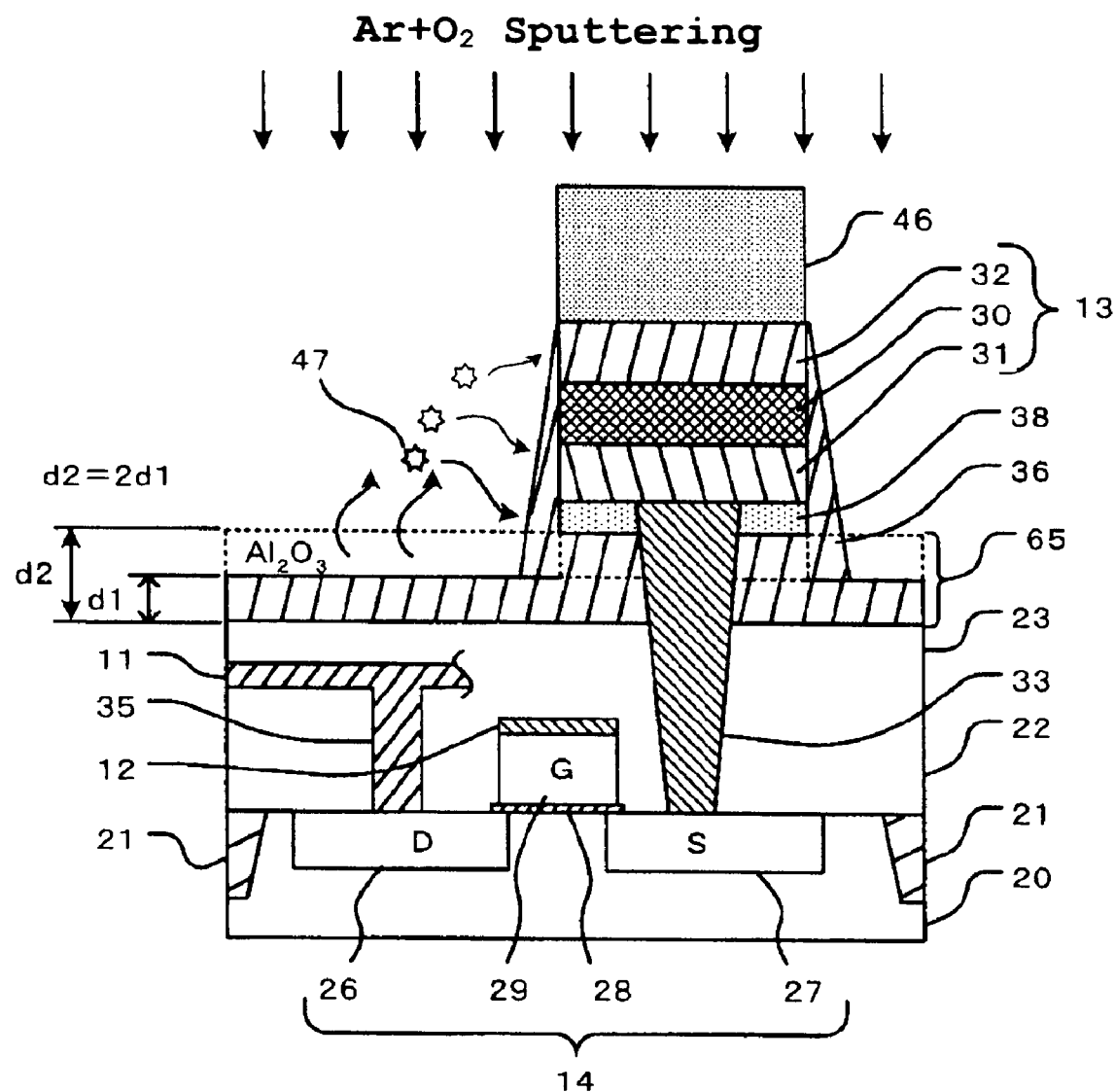
FIG. 12 is a cross-sectional view showing the fabricating process of the non-volatile semiconductor memory device in the second embodiment of the present invention.

Next, fabricating for the non-volatile semiconductor device 60 according to the second embodiment of the present invention will be described below in detail with reference to FIG. 11 and FIG. 12. FIGS. 11 and 12 are cross-sectional diagrams of the non-volatile semiconductor device 60 showing processing steps on the non-volatile semiconductor device 60.

As shown in FIG. 11, an aluminum-oxide film 65 with thickness d2 formed on the interlayer dielectric film 23 instead of the aluminum-oxide film 40 with thickness d1. The thickness d2 is as twice as the thickness d1.

As shown in FIG. 12, the aluminum-oxide film 65 is etched from surface down to depth d1 by sputtering, so that the first protective film 36 is formed.

As same as shown in FIG. 9, the second protective film 37 is formed on the second electrode 32 and the first protective film 36 is formed on the side-wall of the ferroelectric capacitor 13 by sputtering.

Next, a TEOS film (not shown) is formed by CVD. The TEOS film is etched by RIE, so that the TEOS film as the insulator 62 is remained on the second protective film 37 formed on the side-wall of the ferroelectric capacitor 13.

As same as shown in FIG. 12, a residual region under the aluminum-oxide film 65 is etched by sputtering so as to form the third protective film 63.

As same as shown in FIG. 9, the fourth protective film 64 is formed on the second protective film 37 and on the third protective film 63 formed on the side-wall of the ferroelectric capacitor 13 by sputtering. As mentioned above, the nonvolatile memory device 60 having the ferroelectric capacitor including from the first protective film 36 to the fourth protective film 64 with hydrogen barrier performance is obtained.

As mentioned above in this embodiment, the aluminum-oxide film 65 of film thickness d2 is formed on the interlayer dielectric film 23 instead of the aluminum-oxide film 40 having thickness d1. As the thickness d2 is twice as the thickness d1, the aluminum-oxide film 65 can be etched by two steps.

Accordingly, the step coverage on the side-wall of the ferroelectric capacitor 13 is retained. Furthermore, the protective film with hydrogen barrier performance has a structure with four layers from the first protective film to the fourth protective film, so that hydrogen barrier characteristics of the sidewall can be advanced.

In this embodiment, it is explained that the film thickness of the aluminum-oxide film 65 is twice as the aluminum-oxide film 40, however, the thickness can suitably be set in some extent which aluminum-oxide film 65 can be sputtering-etched by two steps. The aluminum-oxide film 65 can be formed as a protective film having stacked layers over four layers for more thickly obtaining.

The insulator 62 is formed between the second protective film 37 and third protective film 63, however, none of the insulator 62 can be suitable.

Third Embodiment

Figure 13:
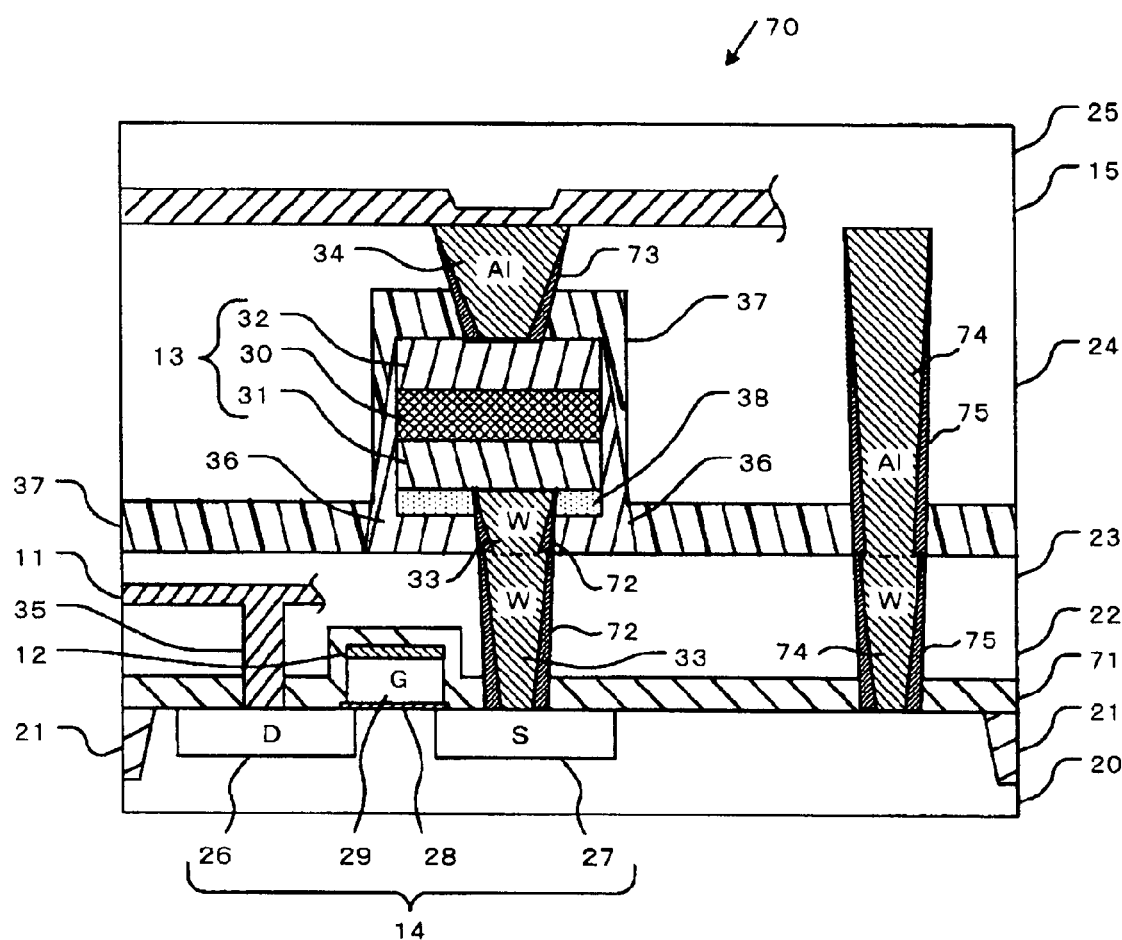
FIG. 13 is a cross-sectional view showing a structure of a non-volatile semiconductor memory device according to a third embodiment of the present invention.

FIG. 13 is a cross-sectional view showing a structure of a nonvolatile-memory semiconductor device according to a third embodiment of the present invention. It is be noted that the same or similar reference numerals are applied to the same or similar parts and elements throughout the drawings, and the description of the same or similar parts and elements will be omitted or simplified.

The third embodiment is different from the first embodiment at a point that a protective film with hydrogen barrier performance is formed also on a side-wall of a contact plug.

As shown in FIG. 13, a non-volatile memory device 70 in this embodiment includes an aluminum-oxide film 71, a fifth protective film 72 with hydrogen barrier performance, a sixth protective film 73 with hydrogen barrier performance and a seventh protective film 75 with hydrogen barrier performance. An aluminum-oxide film 71 is formed on the semiconductor substrate 20 having the cell transistor 14. The fifth protective film 72 is formed on a side-wall of the first contact plug 33 connecting the sources of the cell transistor 14 to the first electrode 31 of the ferroelectric capacitor 13. The sixth protective film 73 is formed on a side-wall of the contact plug 34 connecting the second electrode 32 of the ferroelectric capacitor 13 to the common interconnection 15. The seventh protective film 75 is formed on a side-wall of the third contact plug 74 connecting a substrate of the cell transistor 14 to standard GND (second potential line).

Tungsten (W) is embedded in the third contact plug 74 under the second protective film 37 as same as the first contact plug 33 and Al is embedded in the third contact plug 74 over the interlayer dielectric film 23 as same as the second contact plug 34.

The fifth protective film 72 prevents hydrogen from penetrating a space between the first contact plug 33 and the interlayer dielectric films 22 and 23. The sixth protective film 73 prevents hydrogen from penetrating a space between the second contact plug 34 and the interlayer dielectric film 24. The seventh protective film 75 prevents hydrogen from penetrating a space between the third contact plug 74 and the interlayer dielectric film 22, 23 and 24. As a result, hydrogen barrier characteristics on the sidewall of the ferroelectric capacitor 13 can be advanced.

Next, fabricating for the non-volatile semiconductor device 7 according to the second embodiment of the present invention will be described below in detail with reference to FIGS. 14-18. FIGS. 14-18 are cross-sectional diagrams of the non-volatile semiconductor device 70 showing processing steps on the non-volatile semiconductor device 70.

Figure 14:
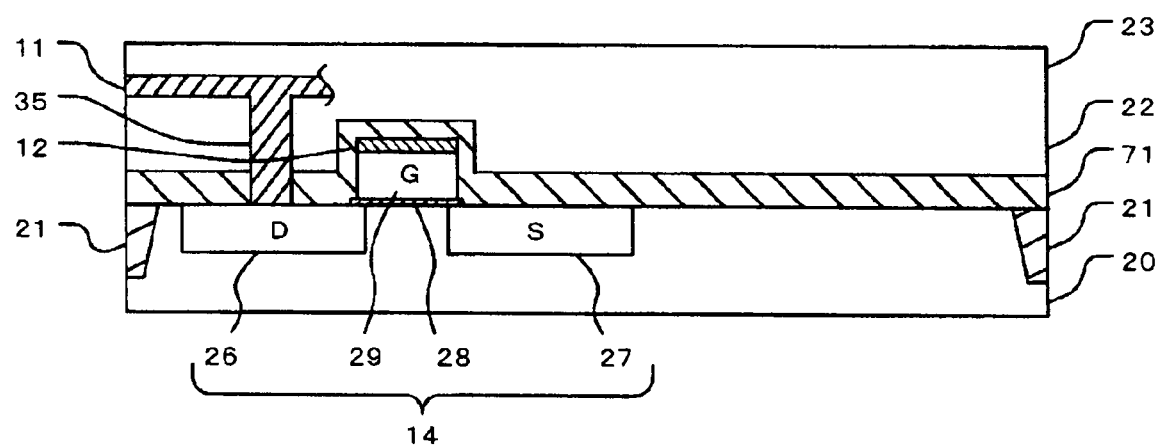
FIG. 14 is a cross-sectional view showing a fabricating process of the non-volatile semiconductor memory device in the third embodiment of the present invention.

As shown in FIG. 14, the cell transistor 14 is formed over the semiconductor substrate 20. The semiconductor substrate 20 including the cell transistor 14 is formed on the aluminum-oxide film 71, and the interlayer dielectric films 22, 23 are formed over the aluminum-oxide film 71.

Figure 15:
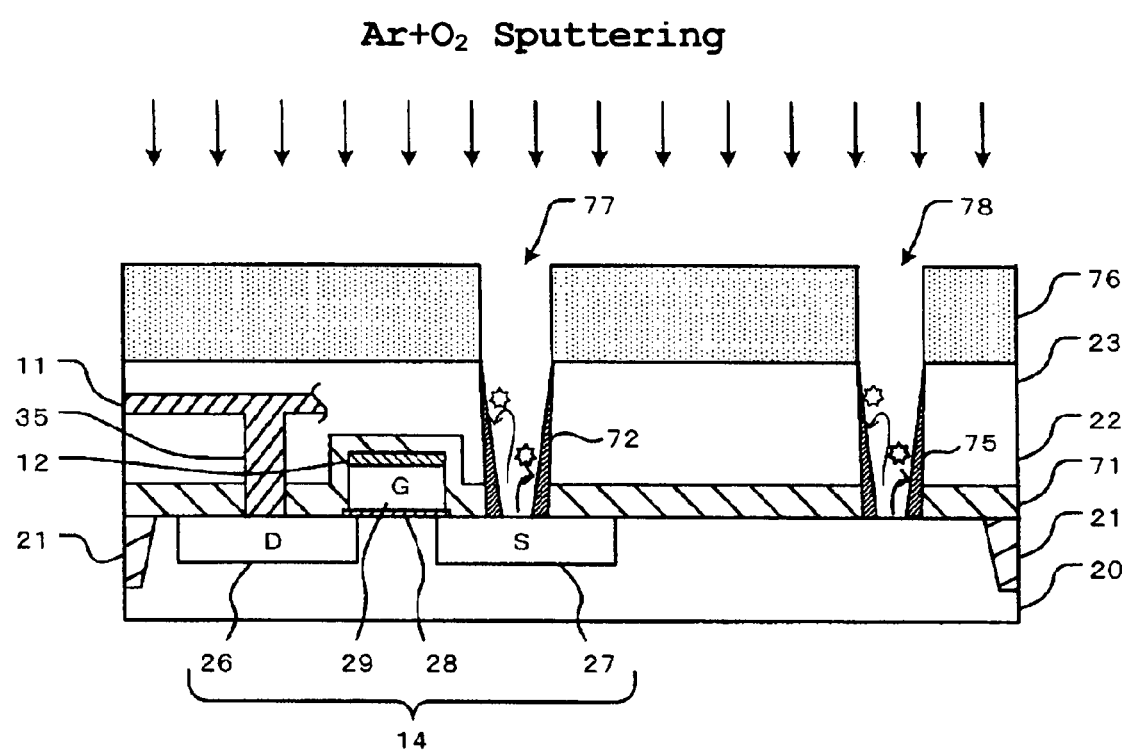
FIG. 15 is a cross-sectional view showing a fabricating process of the non-volatile semiconductor memory device in the third embodiment of the present invention.

As shown in FIG. 15, a contact hole 77 and a contact hole 78 are formed. The contact hole 77 is formed for generating the first contact plug 33 from the interlayer dielectric films 22 and 23 to the aluminum-oxide film 71 by RIE using a mask 76, for example a resist, having an opening at a position corresponding to the sources of the cell transistor 14 and at a position corresponding to the substrate of the cell transistor 14. The contact hole 78 is formed for forming the third contact plug 74 under the second protective film 37.

Next, the aluminum-oxide film 71 exposed at the bottom of the contact hole 77 is etched by sputtering to expose the source diffusion layer 27. The aluminum-oxide film 71 scattered by etching is deposited on the side-wall of the inner region of the contact hole 77 to form an under region of the fifth protective film 72.

Simultaneously, the aluminum-oxide film 71 exposed at the bottom of the contact hole 78 is etched to expose the substrate of the transistor 14. The aluminum-oxide film 71 scattered by etching is deposited on the side-wall of the inner region of the contact hole 78 to form an under region of the seventh protective film 75.

Figure 16:
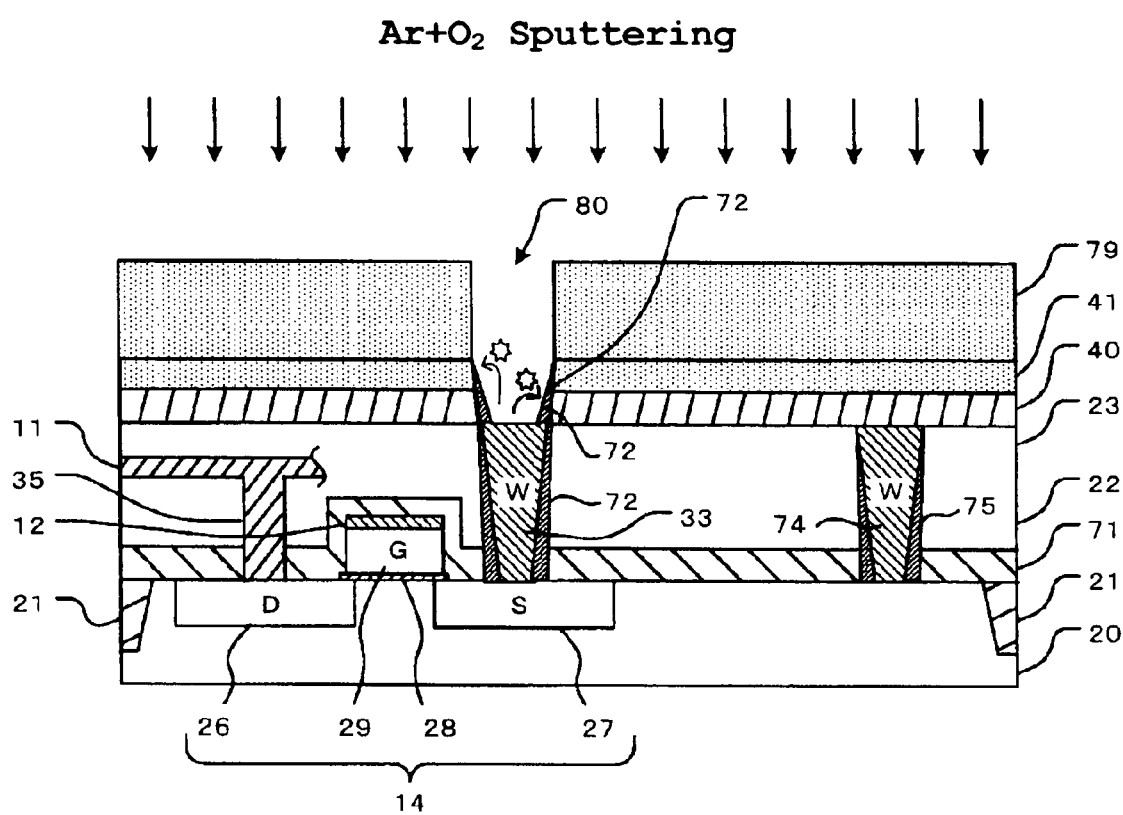
FIG. 16 is a cross-sectional view showing a fabricating process of the non-volatile semiconductor memory device in the third embodiment of the present invention.

As shown in FIG. 16, after removing the mask 76, by CVD and CMP, for example, tungsten is embedded in the contact holes 77 and 78 to form the lower portion of the first contact plug 33 and the lower portion of the third contact plug 74.

Next, the aluminum-oxide film 40 and the TEOS film 41 are formed on the interlayer dielectric film 23 by sputtering, for example. By using a mask 79 having an opening at a position corresponding to the first contact plug 33 by RIE, for example, TEOS film 41 is etched to expose the aluminum-oxide film 40 to form the contact hole 80 at an upper region of the first contact plug 33.

Next, the aluminum-oxide film 40 exposed at the bottom of the contact hole 80 is etched to expose the first contact plug 33 by sputtering. The aluminum-oxide film 71 scattered by etching is deposited on the side-wall of the inner region of the contact hole 80 to form an upper region of the fifth protective film 72.

Figure 17:
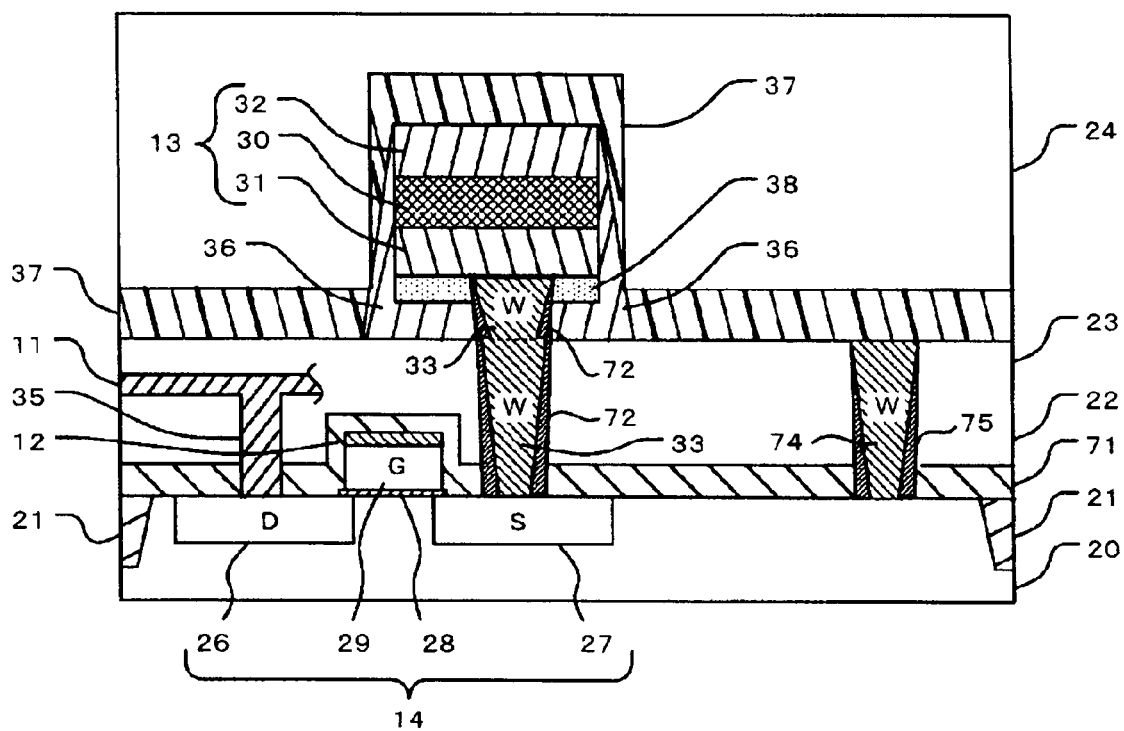
FIG. 17 is a cross-sectional view showing a fabricating process of the non-volatile semiconductor memory device in the third embodiment of the present invention.

As shown in FIG. 17, after removing the mask 79, by CVD and CMP, for example, tungsten is embedded in the contact hole 80 to form the upper portion of the first contact plug 33.

As the same as FIGS. 6-9, the ferroelectric capacitor 13, the first protective film 36 and the second protective film 37 are formed. The interlayer dielectric film 24 is formed on the second protective film 37.

Figure 18:
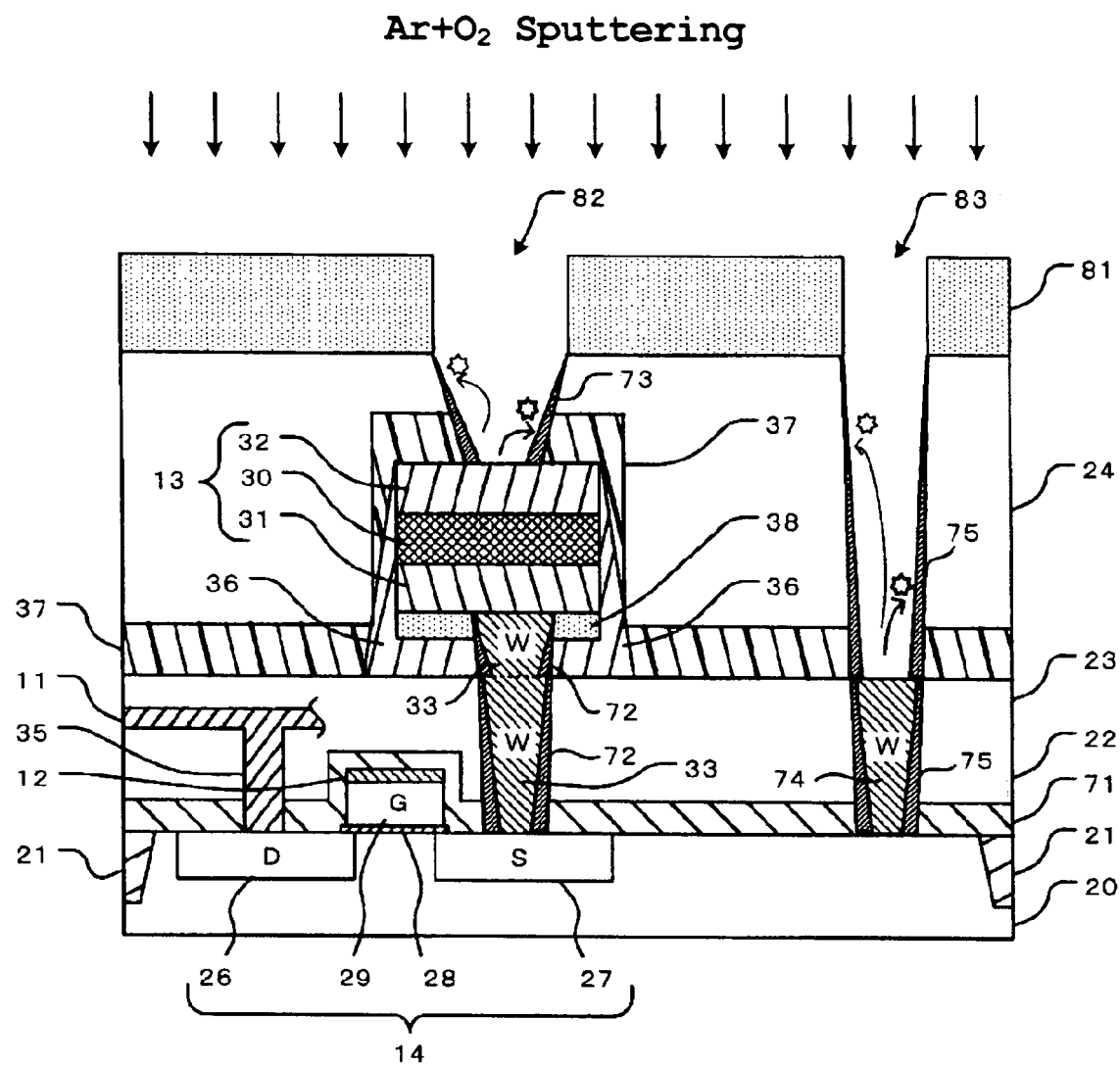
FIG. 18 is a cross-sectional view showing a fabricating process of the non-volatile semiconductor memory device in the third embodiment of the present invention.

As shown in FIG. 18, by using a mask 81 having openings at positions corresponding to the second electrode 32 and the third contact plug 74, for example, a contact hole 82 for forming the second contact plug 34 from the interlayer dielectric film 24 to the second protective film 37 on the second electrode 32 is formed and the contact hole 83 for forming the third contact plug 74 at a region upper the interlayer dielectric film 23 is formed by RIE.

Next, the second protective film 37 exposed at the bottom of the contact hole 82 is etched to expose the second electrode 32 by sputtering. The second protective film 37 scattered by etching is deposited on the side-wall of the inner region of the contact hole 82 to form the sixth protective film 73.

Simultaneously, the second protective film 37 exposed at the bottom of the contact hole 83 is etched to expose the third contact plug 74. The second protective film 37 scattered by etching is deposited on the side-wall of the inner region of the contact hole 83 to form an upper region of the seventh protective film 75.

Next, after removing the mask 81, by CVD and CMP, for example, aluminum is embedded in the contact holes 82 and 83 to form the upper portion of the second contact plug 34 and the upper portion of the third contact plug 74.

Next, the common interconnection 15 is formed on the interlayer dielectric film 24. The second electrode 32 and the common interconnection 15 connect each other via the second contact plug 34 and the insulator 25 is formed. The non-volatile memory device 70 having the ferroelectric capacitor including with hydrogen barrier performance is obtained as shown in FIG. 13.

As mentioned above in this embodiment, the side-walls of the first contact plug 33, the second contact plug 34 and the third contact plug 74 are formed as the fifth protective film 72, the sixth protective film 73 and seventh protective film 75, respectively, with hydrogen barrier performance. Accordingly, hydrogen penetrating in spaces between the first contact plug 33, the second contact plug 34, the third contact plug 74 and the interlayer dielectric films 22, 23 and 24 is prevented so that hydrogen barrier characteristics of the sidewall can be advanced.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. A non-volatile semiconductor memory device, comprising:
    a ferroelectric capacitor being stacked a first electrode, a ferroelectric film and a second electrode in order;
    a first protective film with hydrogen barrier performance, the first protective film being formed under the first electrode and on a side-wall of the ferroelectric capacitor, the first protective film being widened from the second electrode towards the first electrode;
    a second protective film with hydrogen barrier performance, the second protective film being formed over the second electrode and on the first protective film formed on the side-wall of the ferroelectric capacitor, the second protective film being widened from the first electrode towards the second electrode;
    a cell transistor, a source of the cell transistor being connected to the first electrode, a drain of the cell transistor being connected to a bit line and a gate being connected to a word line.

2. The non-volatile semiconductor memory device according to claim 1, further comprising:
    a third protective film with hydrogen barrier performance, the third protective film being formed under the first protective film formed under the first electrode and over the second protective film formed over the side-wall of the ferroelectric capacitor, the third protective film being widened from the second electrode towards the first electrode;
    a fourth protective film with hydrogen barrier performance, the fourth protective film being formed on the second protective film formed on the second electrode and over the side-wall of the ferroelectric capacitor, the fourth protective film being widened from the first electrode towards the second electrode.

3. The non-volatile semiconductor memory device according to claim 1, further comprising:
    a first contact plug connecting the source to the first electrode;
    a second contact plug connect the second electrode to first potential line; and
    a third contact plug connect a substrate of the cell transistor to a second potential line;
    wherein a fifth protective film with hydrogen barrier performance, a sixth protective film with hydrogen barrier performance and a seventh protective film with hydrogen barrier performance are formed on sidewalls of the first
    contact plug, the second contact plug and the third
    contact plug and are widened from the second electrode towards the first electrode.

4. The non-volatile semiconductor memory device according to claim 1,
    wherein the first protective film and second protective film are aluminum-oxide or titanium-oxide, a component of the first protective film is more oxygen-rich than a component of the second protective film and a component of the second protective film is more aluminum-rich or titanium-rich than in a component of the first protective film.

5. The non-volatile semiconductor memory device according to claim 1,
    wherein a sum of side-wall thicknesses with the first protective film and the second protective film is uniformly formed from the first electrode towards the second electrode.

6. The non-volatile semiconductor memory device according to claim 1, further comprising:
    an insulator being sandwiched between the first electrode and the first protective film.

7. The non-volatile semiconductor memory device according to claim 1,
    wherein the second insulator is formed surrounding the ferroelectric material.

8. The non-volatile semiconductor memory device according to claim 1, further comprising:
    an aluminum-oxide film being formed on the second protective film.

9. The non-volatile semiconductor memory device according to claim 1,
    wherein the first protective film on the side-wall of the ferroelectric capacitor is formed by scattering of the first protective film in sputtering etching and the second the protective film over the side-wall of the ferroelectric capacitor is deposited by sputtering.

10. The non-volatile semiconductor memory device according to claim 1,
    wherein the first protective film is remained on the insulator formed under the first electrode including beneath the first electrode.

11. The non-volatile semiconductor memory device according to claim 2, wherein the first protective film, the second protective film, the third protective film and the fourth protective film are composed of $Al_2O_3$ and the $O_2$ ratios in $Al_2O_3$ of the second protective film, the third protective film and the fourth protective film are equal each other and each of the oxygen ratios is smaller than an $O_2$ ratio in $Al_2O_3$ of the first protective film.

12. The non-volatile semiconductor memory device according to claim 2, further comprising:
the insulator is sandwiched between the second protective film and the third protective film.

13. The non-volatile semiconductor memory device according to claim 2,
wherein side-wall thickness of the third protective film and the fourth protective film is uniformly formed from the first electrode to the second electrode.

14. The non-volatile semiconductor memory device according to claim 3,
wherein the fifth protective film, the sixth protective film and the seventh protective film is formed by scattering of the first protective film in sputtering etching.

15. A method for fabricating a non-volatile semiconductor memory device, comprising:
forming a first protective film with hydrogen barrier performance over a substrate having a cell transistor thereon via an interlayer dielectric film;
stacking a first electrode, a ferroelectric film and a second electrode in order so as to form a ferroelectric capacitor over the first protective film;
etching the first protective film by sputtering etching so as to deposit the first protective film scattered by the etching on the side-wall of the ferroelectric capacitor;
forming a second protective film with hydrogen barrier performance on the first protective film formed on the second electrode and the side-wall of the ferroelectric material by sputtering; and
connecting a source of the cell transistor to the first electrode, a drain of the cell transistor to bit line, a gate of the cell transistor to a word line and the second electrode to a first potential line.

16. The method for fabricating the non-volatile semiconductor memory device according to claim 15, further comprising:
remaining the first protective film on the interlayer dielectric film formed under the first electrode including beneath the first electrode before the depositing the first protective film on the side-wall of the dielectric capacitor;
etching the residual first protective film over the interlayer dielectric film by sputtering and depositing the first protective film scattered by the etching on the side-wall of the ferroelectric capacitor the etching so as to form a third protective film with hydrogen barrier performance between forming the second protective film and connecting the second electrode to first potential line; and
forming a fourth protective film with hydrogen barrier performance over the third protective film.

17. The method for fabricating the non-volatile semiconductor memory device according to claim 15, further comprising:
forming the first insulator with hydrogen barrier performance over the substrate having the cell transistor before forming the interlayer dielectric film;
forming a lower region of a first contact hole and a lower region of a second contact hole in the interlayer dielectric film and the first insulator with hydrogen barrier performance after forming the interlayer dielectric film;
etching the first insulator by sputtering so as to depositing the first insulator scattered by the etching on the side-wall of the lower region of the first
contact hole as a fifth protective film and on the side-wall of the lower region of the second contact hole as a sixth protective film;
embedding a conductive film in the lower region of the first contact hole and the lower region of the second contact hole so as to form a lower region of a first contact plug and a lower region of a second contact plug;
forming the second insulator with hydrogen barrier performance;
forming a upper region of the first contact hole in the second insulator formed on the lower region of the first contact hole lower portion;
etching the second insulator by sputter phosphorous as to depositing the second insulator scattered by the etching on the side-wall of the upper region of the first contact hole as a upper region of the fifth protective film;
embedding the conductive film in the upper region of the first contact hole so as to form an upper region of a first contact plug;
forming a third insulator after forming the ferroelectric capacitor;
forming a upper region of the third contact hole and a upper region of the second contact hole on the ferroelectric capacitor the of third insulator and the lower region of the second contact plug, respectively;
etching the third insulator by sputtering so as to depositing the third insulator scattered by the etching on the side-wall of the third contact hole as a seventh protective film the upper region of the second contact hole as a sixth protective film.

18. The method for fabricating the non-volatile semiconductor memory device according to claim 15, further comprising:
forming a fourth insulator with hydrogen barrier performance on the second protective film.

19. The method for fabricating the non-volatile semiconductor memory device according to claim 18,
wherein the fourth insulator is formed by ALD.

20. The method for fabricating the non-volatile semiconductor memory device according to claim 15,
wherein a part of the first protective film is remained in the etching process of the first protective film.

* * * * *